United States Patent [19]

Krause

[11] Patent Number: 4,539,434

[45] Date of Patent: Sep. 3, 1985

[54] FILM-TYPE ELECTRICAL SUBSTRATE CIRCUIT DEVICE AND METHOD OF FORMING THE DEVICE

[75] Inventor: Dennis L. Krause, Atkinson, N.H.

[73] Assignee: AT&T Technologies, Inc., Berkeley Heights, N.J.

[21] Appl. No.: 513,565

[22] Filed: Jul. 14, 1983

[51] Int. Cl.³ .................... H05K 1/09; H05K 1/16; H05K 3/10

[52] U.S. Cl. ..................... 174/68.5; 204/192 SP; 427/96

[58] Field of Search ............... 174/68.5; 361/397, 402, 361/404, 409, 411; 156/901, 902, DIG. 87; 204/192 SP, 15; 420/427; 29/839–846; 428/901; 427/96

[56] References Cited

U.S. PATENT DOCUMENTS

| | | | |
|---|---|---|---|
| 3,717,563 | 2/1973 | Revitz et al. | 204/192 |
| 3,900,944 | 8/1975 | Fuller et al. | 204/192 X |
| 4,251,326 | 2/1981 | Arcidiacono et al. | 204/15 |
| 4,290,188 | 9/1981 | Ichinosi et al. | 29/591 |
| 4,300,149 | 11/1981 | Howard et al. | 357/71 |

Primary Examiner—A. T. Grimley
Assistant Examiner—Morris H. Nimmo
Attorney, Agent, or Firm—S. I. Rosen

[57] ABSTRACT

An electrical substrate circuit device (10) includes a thick film crossunder conductor (14) and a thin film crossover conductor (16). An intermediate portion of the thick film conductor (14) is covered with a coating (28) of electrically insulating glaze material and opposite end portions (18) of the thick film conductor are electrically connected to thin film contact pads (20) by electrically conductive contact portions (22) in an electrically insulating protective tantalum pentoxide film layer (24). The electrically conductive contact portions (22) are produced by gold material in the end portions (18) of the thick film conductor (14) diffusing into overlying portions of a tantalum film (30) as the tantalum film is converted to the protective tantalum pentoxide film layer (24) by thermal oxidation.

20 Claims, 4 Drawing Figures

FILM-TYPE ELECTRICAL SUBSTRATE CIRCUIT DEVICE AND METHOD OF FORMING THE DEVICE

TECHNICAL FIELD

This invention relates to a film-type electrical substrate circuit device and a method of forming the device, and more specifically to a thick film conductor crossunder-thin film conductor crossover device and a method of forming the device.

BACKGROUND OF THE INVENTION

The F. R. Arcidiacono et al. U.S. Pat. No. 4,251,326 discloses thin film-type electrical substrate circuit devices in which thin film RC networks are fabricated on a substrate utilizing alpha tantalum capacitors, tantalum nitride resistors and electrical conductors, including associated electrical contact pads. Frequently, to reduce cost and to increase the circuit density of the devices, in another known process certain of the contact pads of the thin film RC networks are interconnected by thick-film crossunder conductors utilizing an arrangement in which thick film conductors are formed on the substrate prior to forming the thin film RC networks on the substrate.

More specifically, initially the substrate is cleaned in a known manner and the thick film conductors are formed on the substrate from a gold-filled paste material, such as by screening. After firing of the thick film conductors in a furnace, a coating of an electrically insulating glaze material is applied over an intermediate portion of each thick film conductor and opposite end portions of the thick film conductor are left unglazed. A second coating of the electrically insulating glaze material then is applied over the glazed intermediate portions of the thick film comductors. At the same time, a coating of the electrically insulating glaze material is applied to areas of the substrate in which capacitors are to be formed on the substrate. Following heat-curing of this glaze material, a thin protective layer of a film-forming metal, such as tantalum, is deposited on the substrate, including the unglazed opposite end portions and the glazed intermediate portions of the thick film conductors, by conventional sputtering techniques.

Next, portions of the tantalum layer above the unglazed end portions of the thick film conductors are etched away utilizing a photolithographic masking process, to form "windows" in the tantalum layer and thereby to expose the unglazed conductor end portions. The remainder of the tantalum layer then is thermally oxidized to produce a tantalum pentoxide underlayer which protects the substrate from attack by corrosive etchants during the course of subsequent processing. The thin film resistors, capacitors and conductors of the RC networks then are formed on the tantalum pentoxide layer, with associated contact pads of the networks being formed in direct contact with the exposed unglazed end portions of the thick film conductors, utilizing known material deposition, photolithographic masking, and etching techniques.

The foregoing procedure, in which "windows" are etched in the tantalum film layer above the unglazed opposite end portions of the thick film conductors, possesses a number of disadvantages. For example, the etching operation actually involves several steps, including the application of photoresist, exposure of the photoresist through a mask defining the "windows", removal of the unexposed photoresist, etching of the "windows" in the tantalum film layer, removal of the exposed photoresist and rinsing of the etched substrates in preparation for the next processing step. In addition, the forming of the "windows" in the tantalum film layer exposes the unglazed end portions of the thick film conductors to possible damage from etchant solutions used in the fabricating process, and/or exposes the end portions to contamination from the atmosphere, with deleterious effects upon the electrical characteristics of the subsequently formed thin film RC networks.

Accordingly, a purpose of this invention is to provide a simplified process of fabricating a film-type electrical conductor crossunder-crossover substrate circuit device which does not adversely affect the electrical characteristics of the device.

SUMMARY OF THE INVENTION

In general, the fabricating of a film-type electrical substrate circuit device involves forming a protective coating over a first portion of a film-type electrical conductor on a substrate such that at least a second portion of the electrical conductor is uncoated. A cover film then is formed on the substrate, the protective coating on the first portion of the film-type electrical conductor, and the uncoated portion of the electrical conductor. The cover film then is converted to an electrically-insulating protective film in a manner such that electrically conducting material in the uncoated portion of the film-type electrical conductor diffuses into an adjacent portion of the cover film to form an electrically conducting contact portion in the electrically insulating protective film.

More specifically, the film-type electrical conductor is of elongated construction and is formed from a thick film gold paste. The protective coating is formed on an intermediate portion of the electrical conductor from a glaze material such that opposite end portions of the conductor are exposed. Further, the cover film is formed on the substrate from tantalum, which is converted to an electrically-insulating protective tantalum pentoxide film by thermal oxidation in a manner such that gold in the exposed end portions of the elongated film-type electrical conductor diffuses into adjacent portions of the tantalum film to form the electrically conductive contact portions in the protective tantalum pentoxide film. Electrically conductive thin film contacts then are formed in direct engagement with the electrically conductive contact portions, and a thin film conductor is formed on the tantalum pentoxide layer over the thick film conductor to produce a thick film conductor crossunder-thin film conductor crossover device.

DETAILED DESCRIPTION

Figure 1:
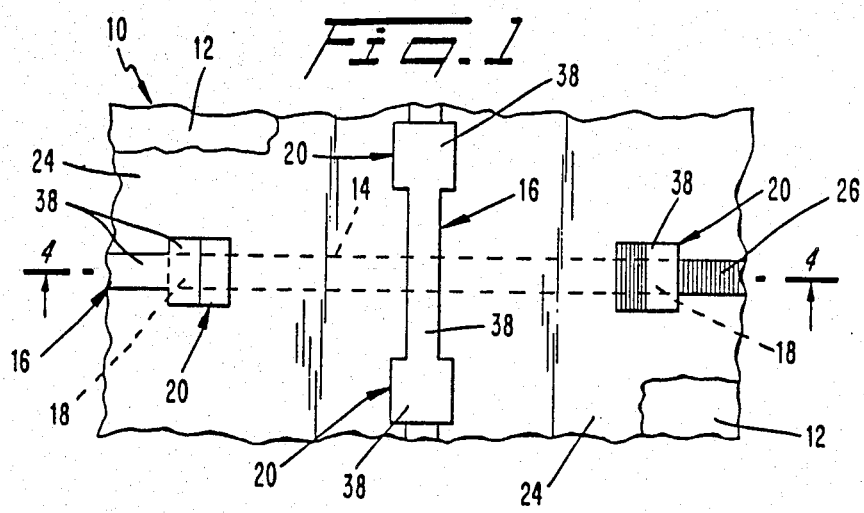
FIG. 1 is a plan view of a portion of a thick film conductor crossunder-thin film conductor crossover electrical substrate circuit device in accordance with the invention.
Figure 4:
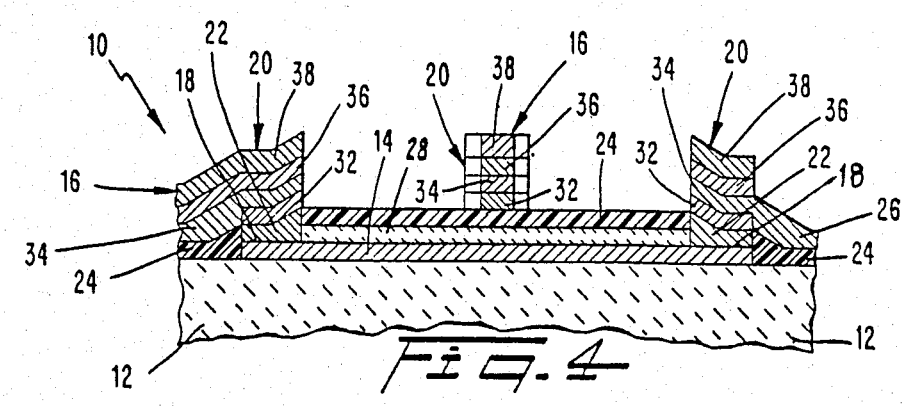

FIGS. 1 and 4 disclose a portion of a film-type electrical substrate circuit device 10 which comprises a substrate 12, an elongated thick film crossunder conductor 14 and a thin film crossover conductor 16 extending transversely with respect to the thick film crossunder conductor 14. Opposite end portions 18 of the thick film conductor 14 are electrically connected to respective thin film electrical contact pads 20 by electrically conductive contact portions 22 (FIG. 4) formed in a protective electrically insulating tantalum pentoxide film 24.

By way of illustration, the electrical substrate circuit device 10 may include an RC network of a type as disclosed in the F. R. Arcidiacono et. al U.S. Pat. No. 4,251,326, issued Feb. 17, 1981, and entitled "Fabricating an RC Network Utilizing Alpha Tantalum," the disclosure of which is hereby incorporated by reference. Accordingly, one of the thin film electrical contact pads 20 (left-hand side of FIG. 1) to which the thick film crossunder conductor is connected, may be connected to associated thin film circuitry, such as an alpha tantalum capacitor (not shown), by a second thin film conductor 16 (FIGS. 1 and 4). The other thin film electrical contact pad 20 (right-hand side of FIG. 1) to which the thick film cross under conductor 14 is connected, may be connected to associated thin film circuitry, such as a second alpha tantalum capacitor (not shown), by a thin film tantalum nitride resistor 26. Similarly, the thin film crossover conductor 16 may interconnect associated thin film electrical contact pads 20 which are located at opposite ends of the conductor and which are connected to other associated thin film circuitry (not shown).

More specifically, the substrate 12 may be of any suitable material, such as ceramic. After cleaning of the substrate 12 in a known manner, the thick film conductor 14 is formed on the substrate, such as by screening a gold paste onto the substrate. For example, the gold paste may be that available from the E. I. Du Pont de Nemours Company under the trademark "Du Pont 4088." The substrate 12 then is placed in a furnace and the thick film conductor is fired at 980° C. for a period of about seven and one-half minutes, utilizing ramp-up and ramp-down times, respectively, of about five minutes. The completed thick film conductor 14 may have a thickness on the order of ten to thirteen microns.

Figure 2:
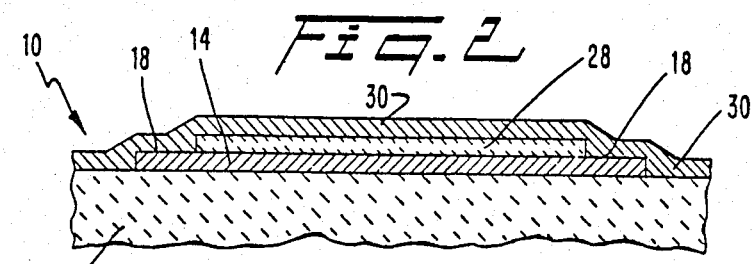
FIGS. 2, 3 and 4 are cross-sectional views taken along a line designated 4—4 in FIG. 1, illustrating successive stages in the manufacture of the electrical substrate circuit device in FIG. 1.

Subsequently, referring to FIG. 2, a coating 28 of glaze material is formed over an intermediate portion of the thick film-conductor 14 such that the opposite end portions 18 of the thick film conductor are uncoated and remain exposed. The coating 28 of the glaze material may be formed in two successive layers to a final thickness on the order of forty microns, with each layer being fired in a furnace at on the order of 870° C. for a period of about sevan and one-half minutes, utilizing ramp-up and ramp-down times, respectively, of about five minutes. The coating 28 of glaze material may be, by way of illustration, that available from E. I. DuPont de Nemours Company under the trademark "DuPont 9615". In conjunction with the forming of the second layer of the glaze coating 28, a layer of the glaze material also may be formed in those areas (not shown) of the substrate 12 in which capacitors (not shown) are to be formed on the substrate.

Referring again to FIG. 2, a thin cover layer 30 of a film-forming metal, such as tantalum, then is deposited on the substrate 12, including the coating 28 of glaze material on the thick film conductor 14 and the uncoated exposed end portions 18 of the thick film conductor. The tantalum film layer 30 may be formed, by way of example, by magnetically enhanced sputtering to a thickness on the order of 750 angstroms.

In accordance with this invention, the tantalum film cover layer 30 next is thermally oxidized so as to convert the tantalum film cover layer to the electrically insulating protective tantalum pentoxide layer 24 (FIG. 3) which protects the substrate 12 from attack by corrosive etchants during the course of subsequent processing. By way of illustration, the thermal oxidation step may be carried out at on the order of 550° C. for a period of about five hours, utilizing ramp-up and ramp-down times, respectively, on the order of two hours. During the thermal oxidation of the tantalum film cover layer 30, it has been found that gold material in the end portions 18 of the thick film conductor 14 migrates or diffuses upward into overlying portions of the tantalum film cover layer to a sufficient degree so as to form the electrically conductive contact portions 22 (FIG. 3) in the resultant tantalum pentoxide layer 24.

After the tantalum film cover layer 30 has been converted to the tantalum pentoxide layer 24 and the electrically conductive contact portions 22 have been formed in the tantalum pentoxide layer by thermal oxidation as above described, the above-mentioned thin film circuitry, including the conductors 16, contact pads 20 and tantalum nitride resistor 26, are formed on the tantalum pentoxide layer utilizing film deposition and etching techniques as disclosed in the above-mentioned F. R. Arcidiacono et al. U.S. Pat. No. 4,251,326. Thus, the conductors 16 and the thin film contact pads 20 each may include an alpha tantalum layer 32, a tantalum nitride layer 34, a composite "glue" layer 36 formed by successively deposited titanium and palladium films, and a gold layer 38, as disclosed in that patent.

More specifically, the innermost alpha tantalum layer 32 of the contact pads 20 adjacent the opposite ends of the thick film conductor 14 are formed in direct engagement with respective ones of the contact portions 22 in the tantalum pentoxide layer 24. Thus the contact portions 22 electrically connect the contact pads 20, and thus the adjacent thin film conductor 16 and tantalum nitride resistor 26, respectively, to the thick film conductor 14. Accordingly, the thick film conductor 14 and the adjacent contact pads 20 are electrically interconnected in accordance with this invention without etching "windows" in the tantalum film cover layer 30 so as to expose the end portions 18 of the thick film conductor 14, as has been done in a previous process. Thus, a number of various processing steps required in the etching of the "windows" in the tantalum film cover layer 30, and potential damage or contamination of the end portions 18 of the thick film conductor 14 as a result of the etching operation, are eliminated. In addition, electrical characteristics of the film-type electrical substrate circuit device 10 fabricated in accordance with this invention, such as contact noise level, third harmonic voltage linearity, circuit resistance and leakage current, compare favorably with devices fabricated by the previous process.

Figure 3:
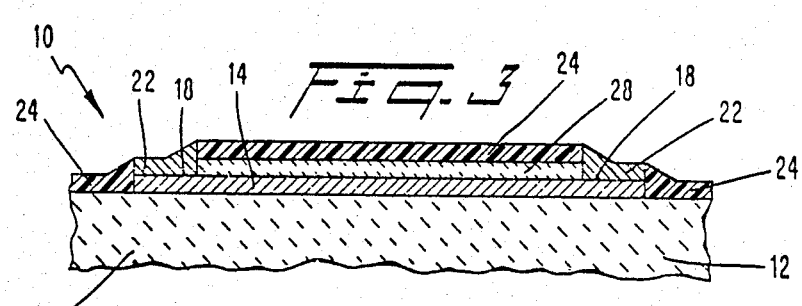

In summary, a new and improved film-type electrical substrate circuit device 10 and a method of forming the device has been disclosed. In this regard, after the tantalum film cover layer 30 (FIG. 2) has been deposited on the substrate 12, including the glaze-coated intermediate portion and the uncoated end portions 18 of the thick film conductor 14, the tantalum film cover layer is converted to the electrically insulating protective tantalum pentoxide layer 24 as illustrated in FIG. 3, by thermal oxidation. During the thermal oxidation process, gold material in the uncoated end portions 18 of the thick film conductor 14 migrates or diffuses upward into overlying portions of the tantalum film cover layer 30 to form the electrically conductive contact portions 22 in the tantalum pentoxide layer 24 as illustrated in FIG. 3. Subsequently, the adjacent thin film contact pads 20 (FIGS. 1 and 4) are formed in direct engagement with the contact portions 22, so that the contact portions electrically connect the thick film conductor 14 to the thin film contact pads. Accordingly, the necessity for etching "windows" in the tantalum film cover layer 30 to expose the end portions 18 of the thick film conductor 14 for subsequent forming of the thin film contact pads 20 in direct engagement with the end portions, with possible damage and/or contamination of the thick film conductor 14, has been eliminated.

What is claimed is:

1. A method of forming a film-type electrical substrate circuit device, which comprises:
   forming a film-type electrical conductor on a substrate;
   forming a protective layer over a first portion of the film-type electrical conductor, such that at least a second portion of the film-type electrical conductor is exposed;
   forming a cover film on the substrate, on the protective layer on the first portion of the film-type electrical conductor, and on the exposed portion of the film-type electrical conductor; and
   converting the cover film to an electrically-insulating protective film in a manner such that electrically conductive material in the portion of the film-type electrical conductor diffuses into an adjacent portion of the cover film to form an electrically conductive contact area in the electrically insulating protective film.

2. The method as recited in claim 1, which further comprises the step of:
   forming an electrically conductive film contact in direct engagement with the electrically conductive contact area in the electrically insulating film.

3. The method as recited in claim 1, in which:
   the film-type electrical conductor is formed from a thick film gold paste.

4. The method as recited in claim 1, in which:
   the protective layer is formed on the first portion of the film-type electrical conductor from a glaze material.

5. The method as recited in claim 1, in which:
   the cover film is formed from a metal.

6. The method as recited in claim 5, in which:
   the metal is a thin film of tantalum; and
   the tantalum is converted to an electrically-insulating tantalum pentoxide film by thermal oxidation.

7. The method as recited in claim 6, in which:
   the film-type electrical conductor is formed from a thick film gold paste.

8. The method as recited in claim 7, in which:
   the protective layer on the first portion of the film-type electrical conductor is formed from a glaze material.

9. The method as recited in claim 7, in which:
   a thin film electrical conductor is formed on the tantalum pentoxide layer and transversely over the film-type electrical conductor to produce a thick film crossunder-thin film crossover substrate circuit device.

10. The method as recited in claim 9, in which:
    the film-type electrical conductor is formed to be of elongated construction;
    the protective layer is formed over an intermediate portion of the elongated film-type electrical conductor such that opposite end portions of the film-type electrical conductor are exposed; and
    electrically conductive gold material in the exposed end portions of the film-type electrical conductor diffuses into adjacent portions of the tantalum cover film to form electrically conductive contact areas in the electrically-insulating protective tantalum pentoxide film when the cover film is converted to the tantalum pentoxide film.

11. A film-type electrical circuit device, which comprises:
    a substrate;
    a film-type electrical conductor on the substrate;
    a protective coating on a first portion of the film-type electrical conductor;
    a covering film on the substrate, on the protective coating on the first portion of the film-type electrical conductor, and on the second uncoated portion of the film-type electrical conductor; and
    at least one electrically conductive contact portion in the covering film in engagement with said uncoated second portion of the film-type electrical conductor, the contact portion being formed by electrically conductive diffused material of the electrical conductor in the covering film, said covering film including said contact portion and an electrically insulating portion on the first portion of the film-type electrical conductor.

12. A film-type electrical circuit device as recited in claim 11, which further comprises:
    a film-type contact pad formed in direct engagement with the electrically conductive contact portion in the covering film for connecting the film-type electrical conductor to associated circuitry.

13. A film-type electrical circuit device as recited in claim 11, in which:
    the electrically conductive diffused material in the electrically conductive contact portion is gold.

14. A film-type electrical circuit device as recited in claim 11, in which:
    the protective coating on the first portion of the film-type electrical conductor is a glaze material.

15. A film-type electrical circuit device as recited in claim 11, in which:
    the covering film on the substrate and on the first portion of the film-type electrical conductor is oxidized metal.

16. A film-type electrical circuit device as recited in claim 15, in which:
    the oxidized metal is tantalum pentoxide.

17. A film-type electrical circuit device as recited in claim 16, in which:
    the electrically conductive diffused material in the electrically conductive contact portion is gold.

18. A film-type electrical circuit device as recited in claim 17, in which:
    the protective coating on the first portion of the film-type electrical conductor is a glaze material.

19. A film-type electrical circuit device as recited in claim 17, in which the film-type electrical conductor is a thick film conductor, and which circuit device further comprises:

a thin film conductor formed on the tantalum pentoxide layer and extending transversely over the thick film conductor.

20. A film-type electrical circuit device as recited in claim 19, in which:

the film-type electrical conductor is of elongated construction;

the first portion of the film-type electrical conductor which is covered by the protective coating is an intermediate portion of the conductor; and electrically conductive contact portions in the electrically-insulating film are engaged with respective uncoated opposite end portions of the film-type electrical conductor, the contact portions being formed by electrically conductive diffused gold material of the electrical conductor in the electrically insulating tantalum pentoxide film.

* * * * *